(12) United States Patent
Tashiro et al.

(10) Patent No.: US 7,518,388 B2
(45) Date of Patent: Apr. 14, 2009

(54) CONTACTOR FOR ELECTRONIC COMPONENTS AND TEST METHOD USING THE SAME

(75) Inventors: Kazuhiro Tashiro, Kawasaki (JP); Shigeyuki Maruyama, Kawasaki (JP); Daisuke Koizumi, Kawasaki (JP); Takumi Kumatabara, Kawasaki (JP); Keisuke Fukuda, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/979,305

(22) Filed: Nov. 1, 2007

(65) Prior Publication Data

US 2008/0136433 A1  Jun. 12, 2008

Related U.S. Application Data

(62) Division of application No. 10/854,172, filed on May 27, 2004, now Pat. No. 7,309,996.

(30) Foreign Application Priority Data

May 30, 2003 (JP) ............... 2003-154678
Apr. 21, 2004 (JP) ............... 2004-125850

(51) Int. Cl.
*G01R 31/02* (2006.01)
*G01R 31/28* (2006.01)
(52) U.S. Cl. ..................................... 324/757
(58) Field of Classification Search ......... 324/754–762, 324/765, 757, 158.1; 439/482, 86, 91
See application file for complete search history.

(56) References Cited

U.S. PATENT DOCUMENTS 4,027,935 A    6/1977  Byrnes et al.
4,322,682 A *  3/1982  Schadwill ............... 324/761
4,721,903 A    1/1988  Harsch et al.
4,803,424 A *  2/1989  Ierardi et al. ........... 324/761
4,904,935 A *  2/1990  Calma et al. ............ 324/754
6,489,790 B1  12/2002  An et al.
6,624,645 B2   9/2003  Haseyama et al.
7,123,776 B2  10/2006  Jung
2005/0258850 A1* 11/2005  Yamada et al. .......... 324/757

FOREIGN PATENT DOCUMENTS

JP  2000-162270 A   6/2000
JP  2000-221236 A   8/2000
JP  2000-292485 A  10/2000
JP     2003-7412 A   1/2003
JP  2003-208959 A   7/2003

OTHER PUBLICATIONS

Japanese Office Action mailed May 27, 2008, issued in corresponding Japanese Application No. 2004-125850.
Japanese Office Action dated Jan. 15, 2008, issued in corresponding Japanese Application No. 2004-125850.

* cited by examiner

*Primary Examiner*—Ha Tran T Nguyen
*Assistant Examiner*—Trung Q Nguyen
(74) *Attorney, Agent, or Firm*—Westerman, Hattori, Daniels & Adrian, LLP

(57) ABSTRACT

A contactor configured to be electrically connected to the terminals of an electronic component is disclosed. The connector includes multiple contact electrodes contacting the terminals of the electronic component and multiple elastic electrodes each composed of an electrically conductive elastic body. The elastic electrodes generate a pressing force for pressing the contact electrodes against the terminals of the electronic component. The contact electrodes are separable from the elastic electrodes.

13 Claims, 16 Drawing Sheets

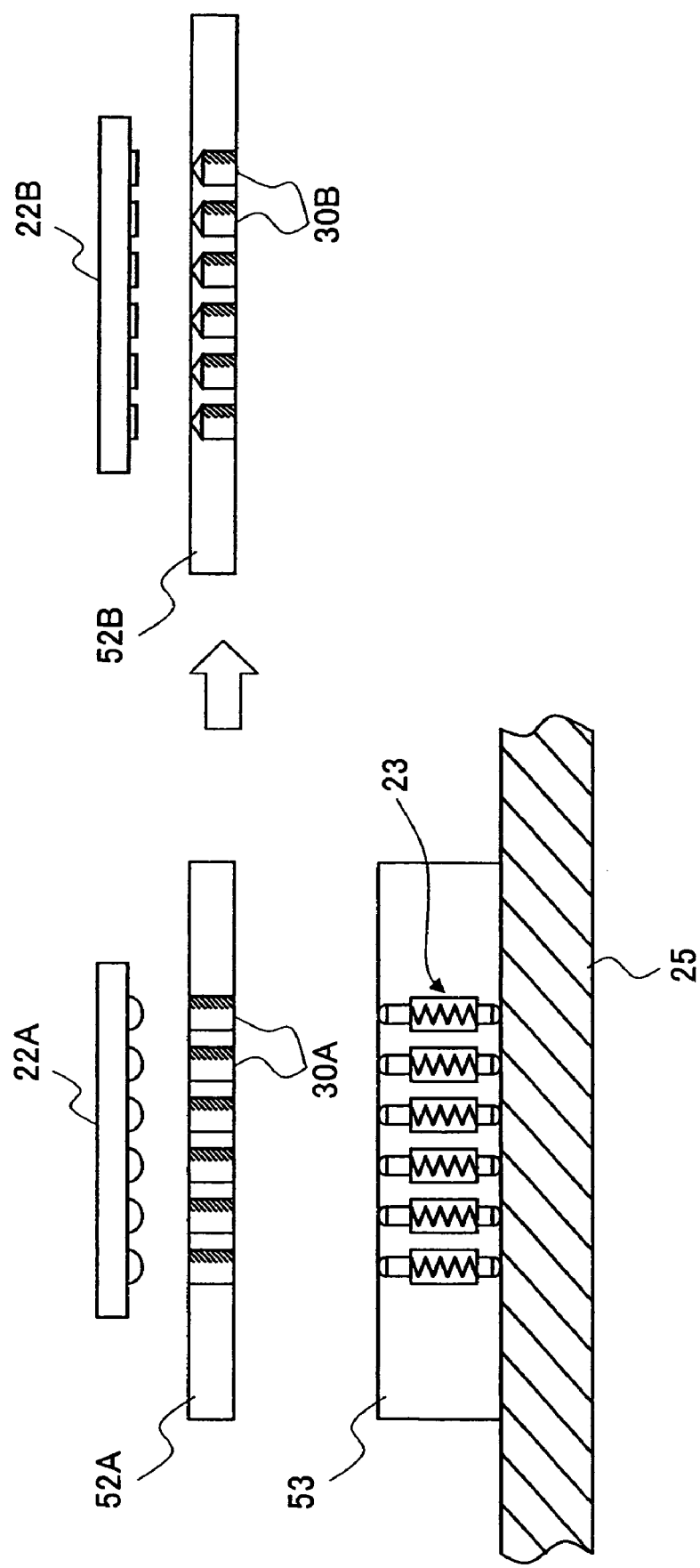

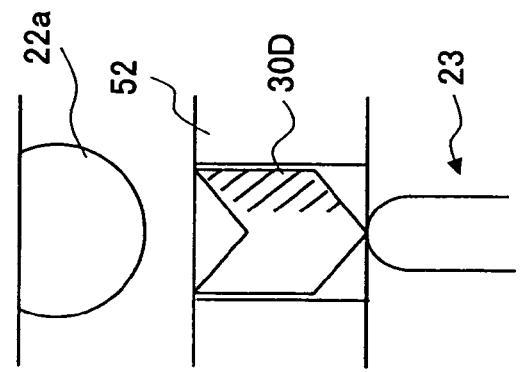
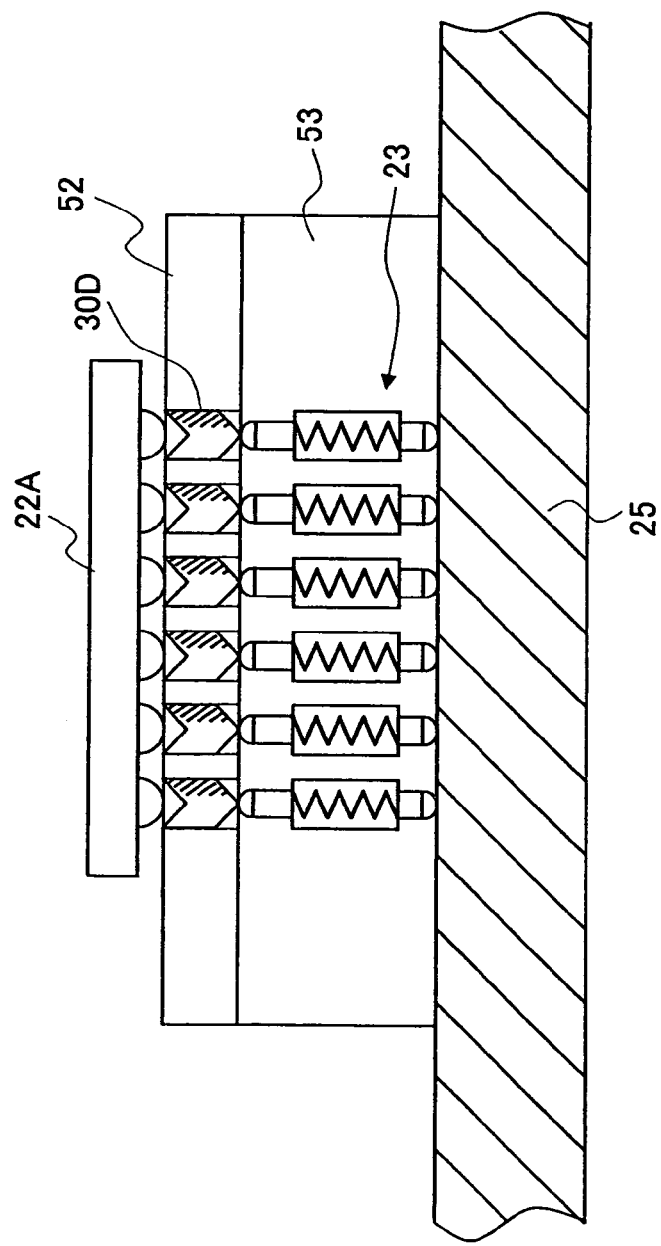

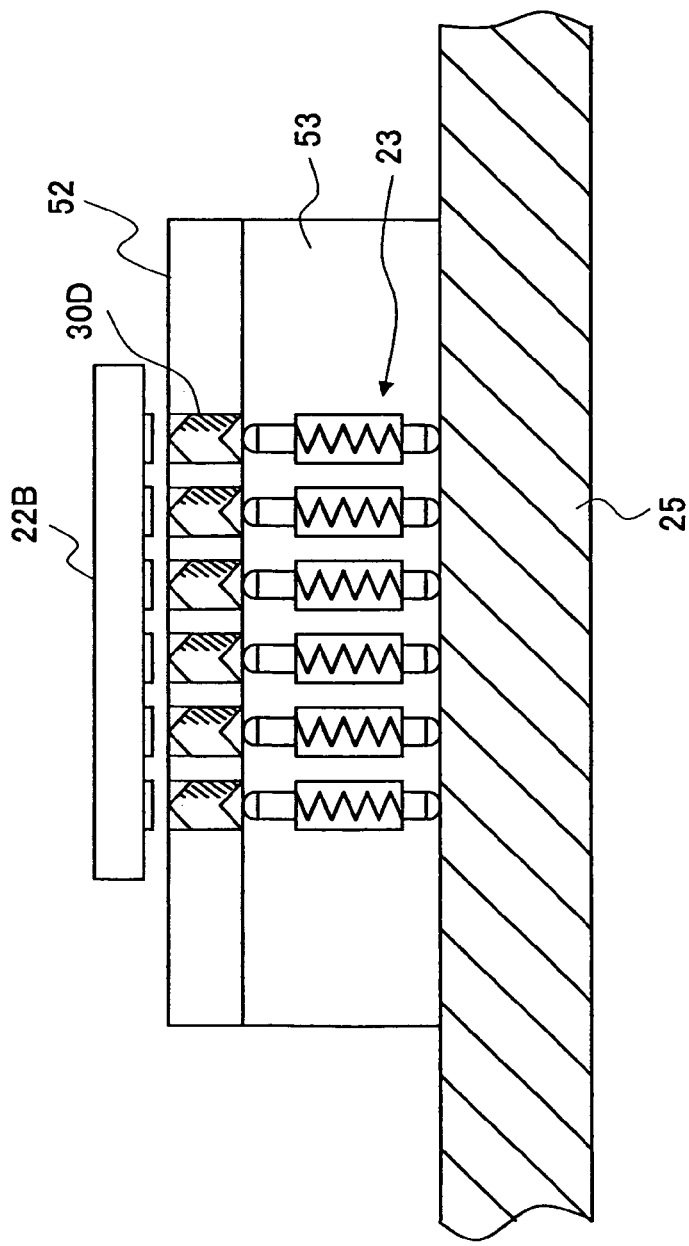
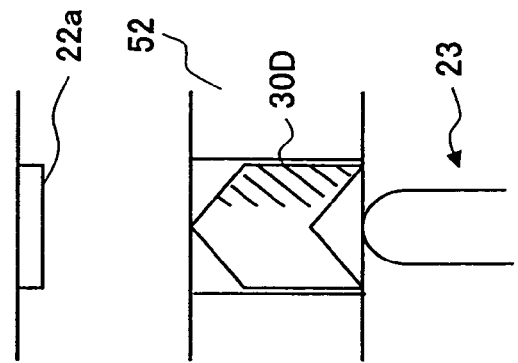
FIG.9A
FIG.9B

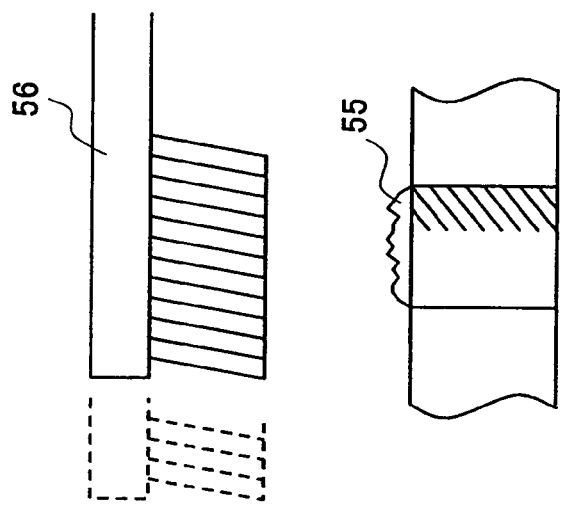
FIG.10B
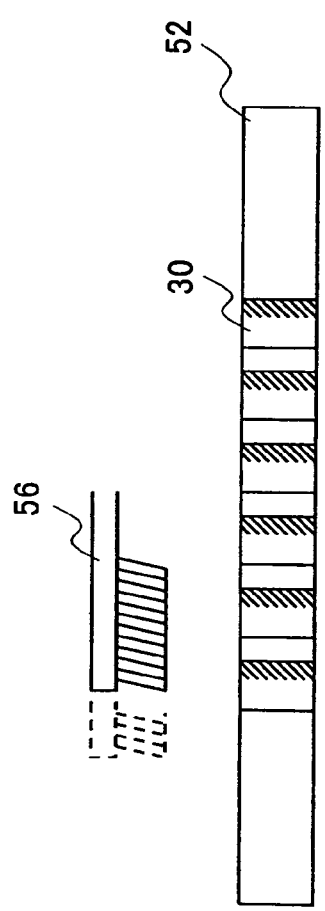
FIG.10A
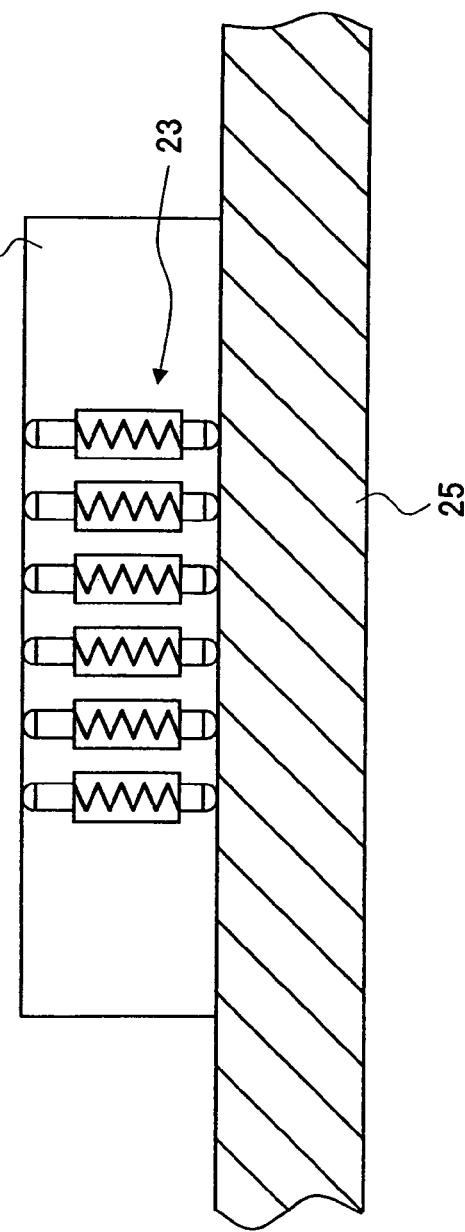

CONTACTOR FOR ELECTRONIC COMPONENTS AND TEST METHOD USING THE SAME

CROSS-REFERENCE TO RELATED APPLICATION

The present application is a division of U.S. application Ser. No. 10/854,172, filed May 27, 2004, which is based on Japanese Priority Patent Applications No. 2003-154678, filed on May 30, 2003, and No. 2004-125850, filed on Apr. 21, 2004, the entire contents of which are hereby incorporated by reference.

BACKGROUND OF THE INVENTION

1. Field of the Invention

The present invention relates to a contactor employed to test the characteristics of electronic components such as semiconductor integrated circuits, and a test method using the contactor.

2. Description of the Related Art

In recent years, there have been increasing demands for reduction in the size and weight of electronic apparatuses such as personal digital assistants (PDAs), cellular phones, and digital cameras. This has also caused strong demands for reduction in the size and weight of electronic components used in these electronic apparatuses, such as semiconductor integrated circuits.

These demands are met by a rapid increase in semiconductor integrated circuit devices of a package form called CSP (Chip Size Package), according to which a package is configured to be substantially equal in size to an IC chip to be packaged. Package forms such as FBGA (Fine-pitch Ball Grid Array) and FLGA (Fine-pitch Land Grid Array) are typical examples of CSP. These semiconductor integrated circuit devices have minute external terminals arranged with fine pitches in order to be reduced in size.

IC packages other than CSP packages, such as QFP (Quad Flat Package) packages, also have minute external terminals arranged with fine pitches in order to meet the demands for reduction in size and weight.

In recent years, CPUs (Central Processing Units) for computers have become more integrated to have an increased number of external terminals. As a result, unlike the above-described CSP packages, the CPUs have become larger in size with finer external terminal pitches. BGA IC packages and LGA (Land Grid Array) IC packages, for instance, may be used in the CPUs. Further, there are demands for adapting the external terminals of these IC packages in shape and size as required by users so that the IC packages have better mountability. Accordingly, IC packages are offered in a variety of shapes with their external terminals varying in shape and size. As a result, a great many types of IC packages are on the market.

Further, in recent years, lead-free solder has been widely used as an outer plating material for the external terminals of IC packages from an environmental point of view. However, in today's transition period, both IC packages using lead-free solder and IC packages using conventionally employed lead solder are being produced.

As a result of the above-described realization of minute external terminals and fine external terminal pitches in CSP and other IC packages, the corresponding "miniaturization" is also required in contactors used to test these IC packages. Accordingly, contact pins provided in the contactors are required to be more complicated and minute in shape.

As described above, an increasing number of IC packages have come to have different external terminal shapes as a result of the diversification of IC packages. In consequence, various types of contactors with contact pins different in the shape of a contact part to be adapted to different IC packages should be prepared for conducting tests.

For the same reason, that is, in order to meet the demands for reduction in size and weight and an increase in integration, attempts have been made to realize smaller IC chips and electrodes. Further, in order to realize an increase in the number of electrodes for better electric characteristics, a rapidly increasing number of IC chips have employed an "area pad" or "area bump" electrode arrangement where the electrodes of a chip are arrayed in a lattice-like manner. Further, attempts have been made to realize fine electrode pitches in these IC chips. From an environmental point of view, lead-free solder is often employed in the area bump electrodes employed in these IC chips. In the present transition period to switch to lead-free solder, and both IC packages using conventional solder and IC packages using lead-free solder are being produced by semiconductor manufacturers. Like the above-described CSP and other IC packages, IC chips also require contactors to have complicated and minute shapes adapted to the electrodes of the IC chips.

FIG. 1 is a diagram showing a contactor 1 having conventional contact pins. The contactor 1, which is used to test the characteristics of a BGA-type IC package 2, includes multiple contact pins 3. Each of the contact pins 3 has a contact electrode 4a contacting a corresponding one of external electrodes 2a of the IC package 2 and an electrode 4b connected to a corresponding terminal (not graphically represented) of a test circuit board 5. A metal coil spring 6 is provided between the contact electrode 4a and the electrode 4b so as to electrically connect the contact electrode 4a and the electrode 4b and to urge the contact electrode 4a and the electrode 4b in opposite directions. This urging (spring) force of the coil spring 6 presses the contact electrode 4a against the external electrode 2a of the IC package 2 so that a suitable contact pressure is generated.

According to this configuration, each terminal of the test circuit board 5 is electrically connected to the corresponding external electrode 2a of the IC package 2 through the corresponding contact pin 3, so that an electrical test can be conducted on the IC package 2. Each contact pin 3 is an integrated unit with the contact electrode 4a and the electrode 4b being fixed to the ends of the coil spring 6. The contact pins 3 are arranged in the contactor 1 in accordance with the arrangement of the external electrodes 2a of the IC package 2. Accordingly, it is impossible to replace each contact electrode 4a as a unit.

The contact part of the contact electrode 4a of each contact pin 3 may be shaped like a crown, an inverse cone, a flat cylinder, or a hemisphere. In order to be adapted to external terminal shapes and sizes of IC packages, the contact pins 3 should be prepared in various types different from one another in the detailed dimensions of the contact part.

For instance, as a contactor used to test the characteristic of the BGA IC package 2, Japanese Laid-Open Patent Application No. 2000-221236 discloses a configuration where the positions corresponding to electrodes on a contact sheet are pressed from the lower side so that the electrodes are pressed against the electrodes (solder balls) of an IC package positioned above the contact sheet.

As another conventional contactor, a contactor 11 having contact pieces is shown in FIG. 2. The contactor 11 shown in FIG. 2, which is used to test the characteristics of a QFP-type IC package 12, includes multiple spring electrodes 13. Each spring electrode 13 has a contact end 14a contacting a corresponding one of external electrodes 12a of the IC package 12 and an electrode end 14b connected to a corresponding terminal (not graphically represented) of a test circuit board 15. A spring part 14c is provided between the contact end 14a and the electrode end 14b so that the contact end 14a, the electrode end 14b, and the spring part 14c are integrated.

The electrode end 14b is inserted into an opening in the test circuit board 15 to be fixed thereto. The spring part 14c, which has a curved shape, is elastically deformable. Therefore, the elastic deformation force of the spring part 14c presses the contact end 14a against the external terminal 12a of the IC package 12 so that a suitable contact pressure is generated.

According to this configuration, each terminal of the test circuit board 15 is electrically connected to the corresponding external electrode 12a of the IC package 12 through the corresponding spring electrode 13, so that an electrical test can be conducted on the IC package 12. Each contact end 14a is integrated with the corresponding spring electrode 14c. Accordingly, it is impossible to replace only the contact end 14a as a unit.

When an IC package is pushed into such a contactor as described above to be mounted thereon using an automatic machine such as a test handler in a mass production process, "parallel pushing" may not be performable depending on factors such as parallelism on the automatic machine side, board parallelism, and board deflection. This is particularly true in IC packages with a large shape, a large number of external terminals, and fine pitches, such as CPUs.

Accordingly, since contact pins normally show their optimum spring characteristics when they are pushed straight, a normal operating state cannot be obtained, so that contact stability cannot be obtained. Further, springs provided in the contactor are likely to have a shortened useful service life.

Normally, gold, solder, or palladium is used as outer plating material for the external terminals of an IC package. When the external terminals come into contact with the contact electrodes of the contact pins of the contactor, the outer plating of the external terminals may be transferred to the contact electrodes. Particularly, the deposition of transferred solder plating on the contact parts of the contact pins causes a problem. That is, the surface of the solder plating transferred to the contact parts is oxidized into an insulating foreign material, thus resulting in poor contact.

Further, the deposition of foreign material such as dust in a laboratory or the residual resin of an IC package on the contact parts of the contact pins also results in poor contact.

External terminals using lead-free solder, for which there have been increasing demands for environmental reasons, do not permit attachment or mixture of lead in light of the reasons for the demands. At present, however, lead may be attached to the external terminals of even a semiconductor integrated circuit device that meets the "lead-free" demand. Products using lead-free solder and products using the conventional lead solder are both being distributed. Therefore, in a contactor for measuring and testing an IC package, lead transferred to and deposited on the contact parts of the contactor when the contactor comes into contact with external terminals using lead solder may adhere to external terminals using lead-free solder when the contactor next comes into contact therewith.

Further, when a problem occurs in a BGA-type IC package after the IC package is once mounted on a board, an electrical test should be conducted on the IC package after the IC package is removed from the board. At this point, if the IC package has, for instance, solder balls as external terminals, each solder ball of the IC package after being removed from the board is not in its original state with a portion or even a substantial part thereof missing. Accordingly, the external terminals of the IC package removed from the board vary in shape and size.

A contactor used at the time of mounting the IC package on the board cannot be used for the external terminals (or where the external terminals used to be) of the IC package removed from the board. Accordingly, it is only after the same type of solder balls as the original ones are provided on the IC package removed from the board that a test is conducted using the contactor.

When an IC package is newly manufactured, solder balls are provided to the IC package using an automatic machine for providing solder balls. However, solder balls are manually provided one by one to an IC package that is removed from a product in which the IC package has been incorporated. This operation of providing solder balls requires a lot of time and effort.

The same problems as described above, that is, unstable contact in the case where "parallel pushing" is not performable and a shortened useful service life of springs, are likely to occur between contact electrodes on the test circuit board side and the terminals of a test circuit board. Further, a contactor comes into contact with the test circuit board every time the contactor is used. The contact with the terminals of the board is likely to cause damage such as concave scratches and plating peeling to the contactor. This often results in poor contact.

The above-described problems such as unstable contact in the case where "parallel pushing" is not performable, a shortened useful service life of springs, the transfer of chip outer plating and resultant poor contact, and the attachment of lead solder to and the mixture of lead solder into a lead-free product also occur in IC chips. U.S. Pat. No. 4,027,935 discloses a contactor contacting the external electrodes of a chip. The contactor includes contacts (contact pins) that are buckling spring electrodes whose contact parts buckle to move horizontally at the time of contact. Accordingly, contact deficiency and damage to a terminal of a circuit board are likely to occur at the time of contact. Further, since contact displacement is limited, unstable contact in the case where "parallel pushing" is not performable is likely to occur. Further, the material of the contact pins is not freely selectable since priority is given to the spring characteristic of the contact pins. Furthermore, since the contact pins are formed from a plate material by etching or molding, their end shape, or contact electrode shape, is not freely selectable. For the reasons stated above, the above-described problems are likely to occur.

SUMMARY OF THE INVENTION

Accordingly, it is a general object of the present invention to provide a contactor in which the above-described disadvantages are eliminated, and a test method using the contactor.

A more specific object of the present invention is to provide a contactor having contact electrodes that are easy to change in size and shape in accordance with the size and shape of the external terminals of an IC package to be contacted.

The above objects of the present invention are achieved by a contactor configured to be electrically connected to terminals of an electronic component, including: a plurality of contact electrodes configured to contact the terminals of the electronic component; and a plurality of elastic electrodes each composed of an electrically conductive elastic body, the elastic electrodes being configured to generate a pressing force for pressing the contact electrodes against the terminals of the electronic component, wherein the contact electrodes are separable from the elastic electrodes.

The above objects of the present invention are also achieved by a test method performed with an electronic component having external terminals being electrically connected to a test circuit via a contactor, including the steps of: (a) providing a contact electrode holding part on an elastic electrode holding part of the contactor; (b) electrically connecting elastic electrodes of the elastic electrode holding part to terminals of the electronic component by pressing the elastic electrodes against contact electrodes of the contact electrode holding part by pressing the terminals of the electronic component against the contact electrodes; and (c) testing the electronic component with the test circuit and the electronic component being electrically connected via the elastic electrodes and the contact electrodes.

The above objects of the present invention are also achieved by a contactor configured to electrically connect a circuit board to a terminal of an electronic component, including: a first contact electrode configured to contact the terminal of the electronic component; a second contact electrode configured to contact a terminal of the circuit board; and an elastic electrode formed of an electrically conductive elastic body, the elastic electrode being provided between the first and second contact electrodes, wherein at least one of the first and second contact electrodes is separable from the elastic electrode.

The above objects of the present invention are also achieved by a test method performed with an electronic component being electrically connected to a circuit board via a contactor, the contactor including a first electrode configured to contact a terminal of the electronic component, a second contact electrode configured to contact a terminal of the circuit board, and an elastic electrode formed of an electrically conductive elastic body, the elastic electrode being provided between the first and second contact electrodes, the test method including the steps of: (a) providing a first contact electrode holding part holding the first contact electrode and a second contact electrode holding part holding the second contact electrode on an elastic electrode holding part holding the elastic electrode so that at least one of the first contact electrode holding part and the second contact electrode holding part is separable from the elastic electrode holding part; (b) electrically connecting the terminal of the electronic component and the terminal of the circuit board by pressing the second contact electrode against the terminal of the circuit board by pressing the elastic electrode against the second contact electrode as a result of pressing the terminal of the electronic component against the first contact electrode so that the elastic electrode is pressed by the first contact electrode; and (c) testing the electronic component with the terminal of the electronic component and the terminal of the circuit board being electrically connected.

Thus, according to the present invention, a contactor that can easily have the size and shape of contact electrodes changed in accordance with the size and shape of the external electrodes of an IC package or IC chip to be contacted can be realized.

Further, according to the present invention, the contact electrodes are separable from the elastic electrodes. Therefore, it is possible to replace the contact electrodes with ease. Accordingly, it is possible to replace only the contact electrodes in accordance with the shape and size of the external electrodes of an electronic component. As a result, there is no need to replace the entire contactor. Further, there is no need to prepare multiple types of contactors for the external electrodes of various types of electronic components. Since it is possible to separate and detach only a contact electrode holding part holding the contact electrodes, it is possible to replace only the contact electrodes with new or cleaned ones with ease.

Further, according to the present invention, if the contact electrodes are worn out or broken or a foreign material is attached to the contact electrodes in the case of bringing a contactor into contact with the terminals of a test circuit board, the contact electrodes are easily replaced. Further, when spring electrodes buckle at the time of contact, contact with the external terminals of an IC package or IC chip can be made with accuracy. Likewise, contact with the terminals of the test circuit board can be made with accuracy. Further, it is possible to bring the contactor into contact with the test circuit board without damaging the terminals of the test circuit board.

BRIEF DESCRIPTION OF THE DRAWINGS

Other objects, features and advantages of the present invention will become more apparent from the following detailed description when read in conjunction with the accompanying drawings, in which:

FIG. 7 is a diagram showing a method of testing different IC packages by changing contact electrode holding parts according to the third embodiment of the present invention;

FIG. 8A is a sectional view of the contactor in which contact electrodes each having concave and convex opposite ends are provided, and FIG. 8B is an enlarged view of one of the contact electrodes of FIG. 8A and its vicinity according to the third embodiment of the present invention;

FIG. 9A is a sectional view of the contactor in which a contact electrode holding part of FIG. 8A is turned upside down, and FIG. 9B is an enlarged view of one of the contact electrodes of FIG. 9A and its vicinity according to the third embodiment of the present invention;

FIG. 10A is a diagram showing a method of removing a foreign material attached to the contact parts of the contact electrodes, and FIG. 10B is an enlarged view of one of the contact electrodes of FIG. 10A and its vicinity according to the third embodiment of the present invention;

DETAILED DESCRIPTION OF THE PREFERRED EMBODIMENTS

A description is given below, with reference to the accompanying drawings, of embodiments of the present invention.

Figure 1:
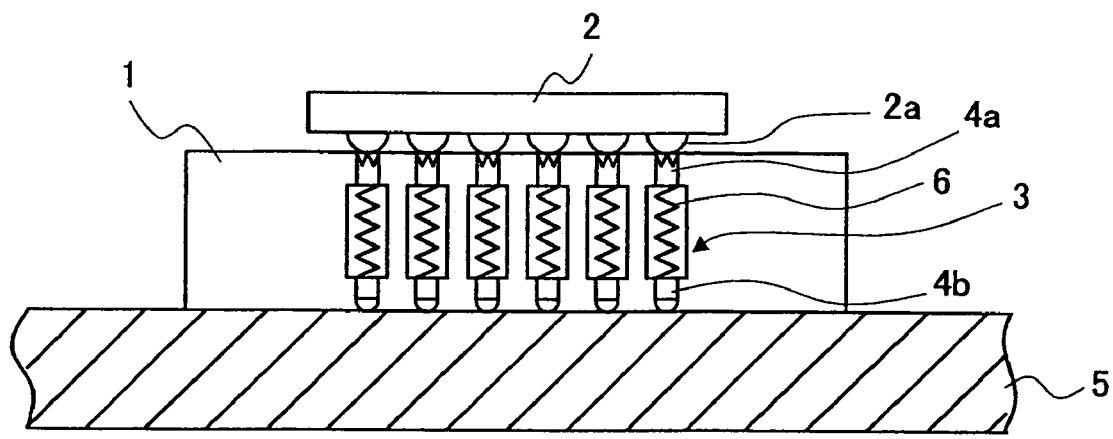
FIG. 1 is a diagram showing a contactor having conventional contact pins.
Figure 2:
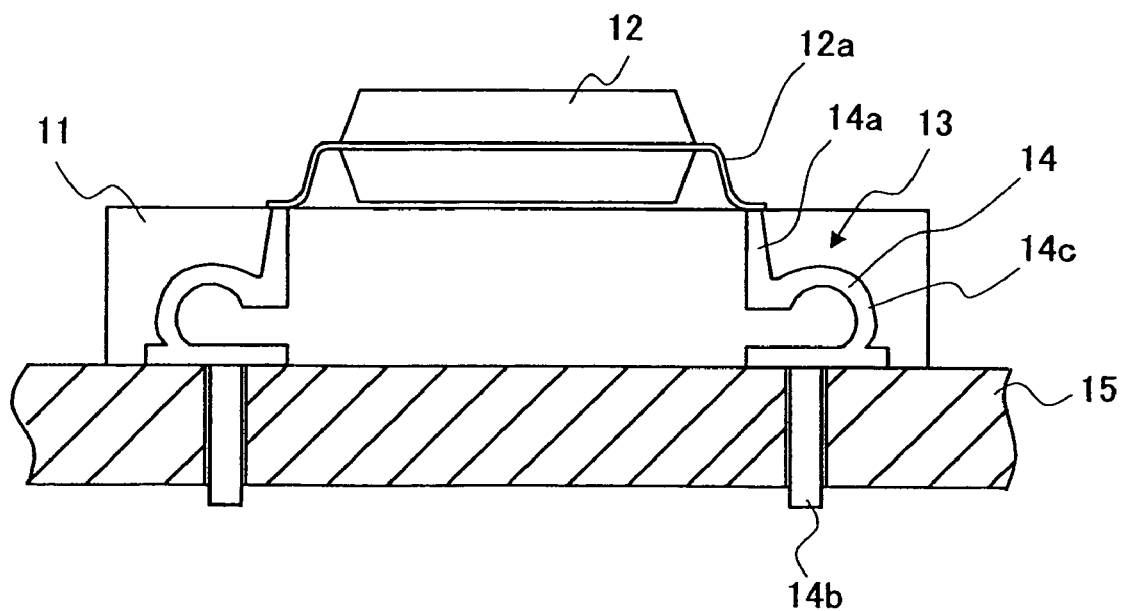
FIG. 2 is a diagram showing a contactor having conventional contact pieces.
Figure 3:
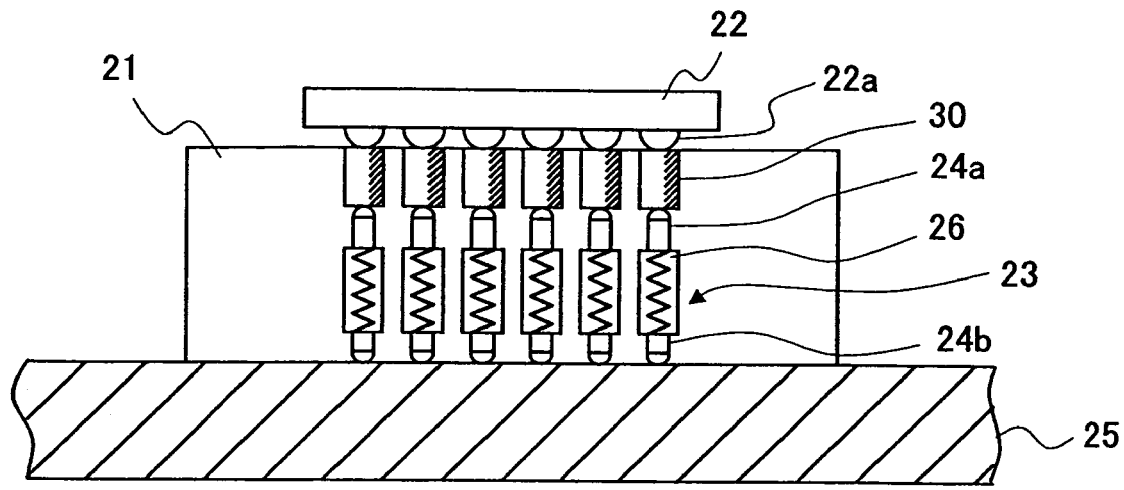
FIG. 3 is a sectional view of a contactor according to a first embodiment of the present invention.

First, a description is given, with reference to FIG. 3, of a contactor 21 according to a first embodiment of the present invention. FIG. 3 is a sectional view of the contactor 21 according to the first embodiment. The contactor 21, which is used to test the characteristics of a BGA-type IC package 22, includes multiple contact pins 23. Each contact pin 23 has an electrode 24a and an electrode 24b. The electrode 24a contacts a corresponding one of contact electrodes 30 contacting external electrodes 22a of the IC package 22. The electrode 24b is connected to a corresponding terminal (not graphically represented) of a test circuit board 25. A metal coil spring 26 is provided between the electrodes 24a and 24b so as to electrically connect the electrodes 24a and 24b and to urge the electrodes 24a and 24b in opposite directions. The urging (spring) force of the coil spring 26 causes the electrode 24a to press the contact electrode 30. As a result, the contact electrode 30 is pressed against the external electrode 22a of the IC package 22, so that a suitable contact pressure is generated. Thus, each contact pin 23 functions as an elastic electrode that generates a contact pressure.

As the material of the contact electrode 30, a metal material such as steel (an SK steel) or copper alloy as a conductive material is preferably used. Surface treatment may be applied on the contact part of the contact electrode 30. For instance, the contact part of the contact electrode 30 may be plated with a platinum metal such as rhodium or palladium, to which solder is less likely to be transferred. Further, the contact part of the contact electrode 30 may be plated with metal having high hardness so as to prevent the wear of the contact part.

According to the above-described configuration, the terminals of the test circuit board 25 are electrically connected to the corresponding external electrodes 22a of the IC package 22 through the contact pins 23 and the contact electrodes 30, so that an electrical test can be conducted on the IC package 22.

Each contact pin 23 is an integrated unit with the electrodes 24a and 24b being fixed to the ends of the coil spring 26. The contact pins 23 are arranged in the contactor 21 in accordance with the arrangement of the external electrodes 22a of the IC package 22. Each contact electrode 30 is slightly movable lengthwise in the contactor 21. When the contact electrode 30 is pressed by the external electrode 22a of the IC package 22, the contact electrode 30 moves lengthwise to press the electrode 24a of the contact pin 23. As a result, the spring 26 is compressed so that a pressing force is generated. This pressing force generated by the spring 26 corresponds to a contact pressure between the contact electrode 30 and the external electrode 22a of the IC package 22.

As described above, according to this embodiment, the contact electrodes 30, which are components separate from the contact pins 23, are interposed between the contact pins 23 and the external electrodes 22a of the IC package 22. Accordingly, it is possible to change only the contact electrodes 30 in accordance with the shape of the external electrodes 22a. For instance, if the external electrodes 22a are equal in arrangement and pitch to the contact pins 23 (electrodes 24a), but are different therefrom in shape and size, the contact electrodes 30 may be replaced with appropriately shaped contact electrodes 30A, 30B, or 30C in accordance with the shape and size of the external electrodes 22a as shown in FIG. 4.

Figure 4:
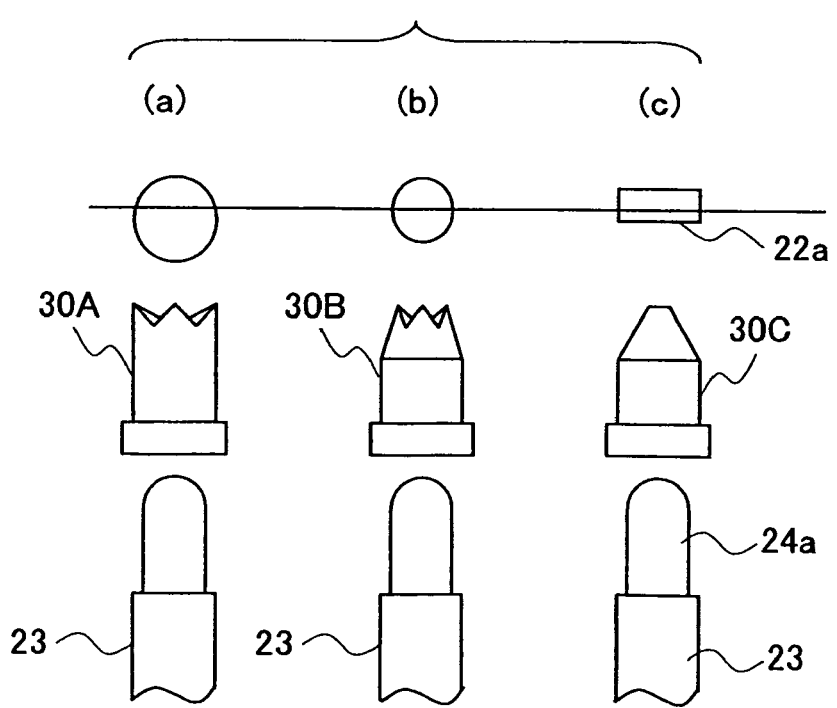
FIG. 4 is a diagram showing contact electrodes used for external electrodes different in shape and size according to the first embodiment of the present invention.

Referring to FIG. 4, the contact electrode 30A shown in (a) is shaped to be used for an external electrode (a projection electrode) such as a solder ball relatively large in size. The contact electrode 30B shown in (b) is shaped to be used for an external electrode (a projection electrode) such as a solder ball relatively small in size. The contact electrode 30C shown in (c) is shaped to be used for a flat external electrode such as a land.

Thus, by replacing the contact electrodes 30 in the contactor 21 with those (contact electrodes 30A, 30B, or 30C) of a different shape, the contactor 21 can be used for multiple types of IC packages. For instance, after testing a BGA-type IC package having solder balls as external electrodes using the contact electrodes 30A shown in (a) of FIG. 4, the contact electrodes 30A may be replaced with the contact electrodes 30C so that an LGA-type IC package can be tested.

On the other hand, for instance, when an IC package provided with solder balls at the time of production malfunctions after being incorporated into a product, an operational test is conducted on the IC package after removing the IC package from a board by melting the solder balls. In this case, it is also possible to make contact with electrodes from which the solder balls have been melted away using the contact electrodes 30C.

Figure 5:
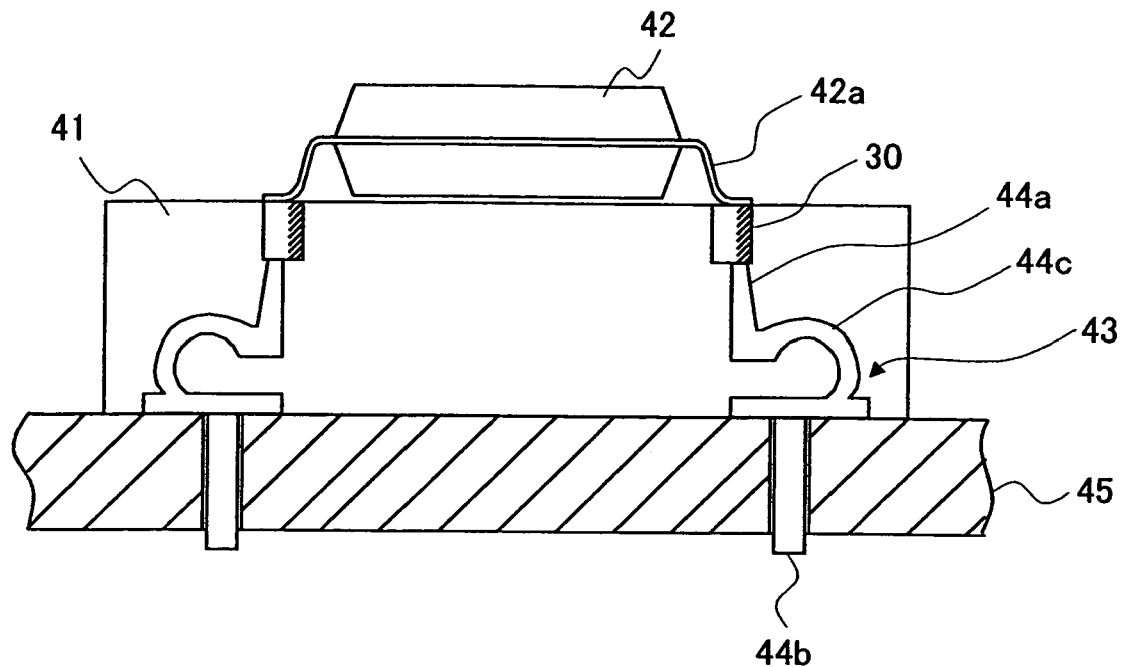
FIG. 5 is a sectional view of a contactor according to a second embodiment of the present invention.

Next, a description is given, with reference to FIG. 5, of a contactor 41 according to a second embodiment of the present invention. FIG. 5 is a sectional view of the contactor 41 according to the second embodiment. The contactor 41, which is used to test the characteristics of a QFP-type IC package 42, includes multiple spring electrodes 43. Each spring electrode 43 has electrode ends 44a and 44b. The electrode end 44a contacts a corresponding one of the contact electrodes 30 contacting external electrodes 42a of the IC package 42. The electrode end 44b is connected to a corresponding terminal (not graphically represented) of a test circuit board 45. A spring part 44c is provided between the electrode ends 44a and 44b so that the electrode ends 44a and 44b and the spring part 44c are integrated.

The electrode end 44b is inserted into an opening in the test circuit board 45 to be fixed thereto. The spring part 44c, which has a curved shape, is elastically deformable. Therefore, the elastic deformation force of the spring part 44c presses the electrode end 44a against the contact electrode 30. As a result, the contact electrode 30 is pressed against the external terminal 42a of the IC package 42 so that a suitable contact pressure is generated. Thus, each spring electrode 43 functions as an elastic electrode that generates a contact pressure.

It is preferable that the spring electrodes 43 be made of an electrically conductive and elastic metal. For instance, the spring electrodes 43 may be formed using a copper alloy such as beryllium copper or phosphor bronze.

According to the above-described configuration, the terminals of the test circuit board 45 are electrically connected to the corresponding external electrodes 42a of the IC package 42 through the spring electrodes 43 and the contact electrodes 30, so that an electrical test can be conducted on the IC package 42. As in the contactor 21 according to the first embodiment, the contact electrodes 30 are provided as components separate from the spring electrodes 43 and are replaceable in the contactor 41. Accordingly, in the contactor 41 according to this embodiment, for instance, when part of the contact electrode 30 is damaged or foreign material is attached to the contact electrode 30, it is possible to replace only the contact electrode 30 independently as in the contactor 21 according to the first embodiment.

Figure 6:
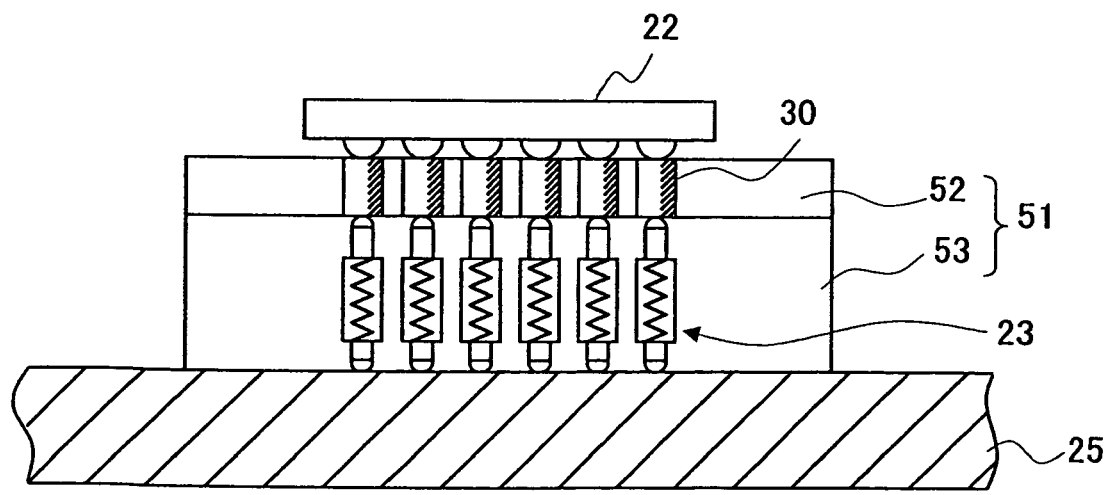
FIG. 6 is a sectional view of a contactor according to a third embodiment of the present invention.

Next, a description is given, with reference to FIG. 6, of a contactor 51 according to a third embodiment of the present invention. FIG. 6 is a sectional view of the contactor 51 according to the third embodiment. In FIG. 6, the same elements as those of FIG. 3 are referred to by the same numerals and a description thereof is omitted.

The contactor 51 includes a contact electrode holding part 52 holding the contact electrodes 30 and an elastic electrode holding part 53 holding the contact pins 23. The contact electrode holding part 52 is formed as a component separate from the elastic electrode holding part 53 so as to be separable easily therefrom. Accordingly, only the elastic electrode holding part 53 is fixed to the test circuit board 25, and the IC package 22 is mounted on the contact electrode holding part 52 with the contact electrode holding part 52 being placed on the elastic electrode holding part 53.

According to this embodiment, the contact electrode holding part 52 holding the multiple contact electrodes 30 is formed as a separable single component. Accordingly, in the case of replacing the contact electrodes 30, the multiple contact electrodes 30 may be replaced simultaneously by replacing the contact electrode holding part 52.

For instance, when the contact electrodes 30 are used for a long period of time so that the contact parts thereof are worn out or oxidized to cause degradation of contact, it is possible to use the contactor 51 by replacing only the contact electrode holding part 52 with a new one without replacing the elastic electrode holding part 53, whose manufacturing cost is relatively high. Accordingly, it is possible to reduce contactor costs.

Further, for instance, as shown in FIG. 7, after testing a BGA-type IC package 22A, a contact electrode holding part 52A may be replaced with a contact electrode holding part 52B so that an LGA-type IC package 22B can be tested. At this point, the multiple contact electrodes 30A can be replaced at the same time. This saves an operator time and effort.

Alternatively, the contactor 51 may be made usable for both the BGA IC package 22A and the LGA-type IC package 22N by turning the contact electrode holding part 52 upside down. That is, as shown in FIGS. 8A and 8B and FIGS. 9A and 9B, each of contact electrodes 30D may be configured to have a concave portion on one end (a concave end) and a convex portion on the other end (a convex end) so that it is easy for a projection electrode such as a solder ball to contact the concave end and it is easy for a flat electrode to contact the convex end.

Referring to FIGS. 8A and 8B, at the time of testing the BGA IC package 22A, the contact electrode holding part 52 holding the above-described contact electrodes 30D is disposed so that the concave ends of the contact electrodes 30D come into contact with the external electrodes 22a of the IC package 22A. On the other hand, referring to FIGS. 9A and 9B, at the time of testing the LGA IC package 22B, the contact electrode holding part 52 is disposed upside down so that the convex ends of the contact electrodes 30D come into contact with the external electrodes 22a of the IC package 22B.

Thus, by turning the contact electrode holding part 52 upside down, a contactor applicable to both the BGA IC package 22A and the LGA IC package 22B can be realized.

Further, as shown in FIGS. 10A and 10B, when foreign material 55 is attached to the contact part of the contact electrode 30, the foreign material 55 can be easily removed with a brush 56 after detaching the contact electrode holding part 52. At this point, the detached contact electrode holding part 52 may be returned to where it was immediately after the foreign material 55 is removed therefrom by cleaning. Alternatively, the detached contact electrode holding part 52 may be replaced with another clean contact electrode holding part 52. As a result, it is possible to remove the foreign material 55 from the detached contact electrode holding part 52 in a separate process while continuing a test. Accordingly, the test process can be continued without being affected by the attachment of the foreign material 55.

Figure 11:
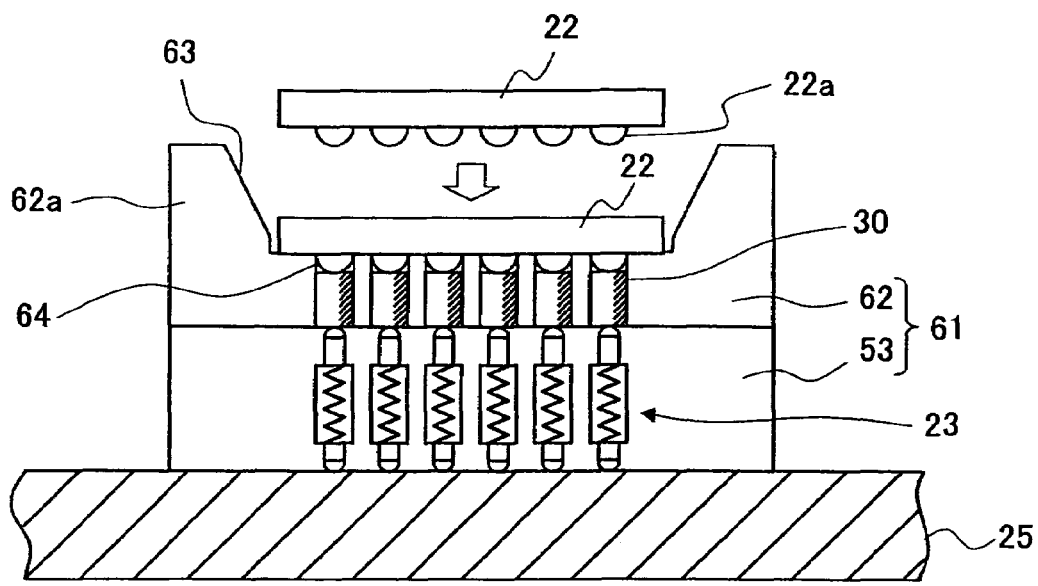
FIG. 11 is a sectional view of a contactor according to a variation of the third embodiment of the present invention.

Next, a description is given, with reference to FIG. 11, of a variation of the third embodiment. FIG. 11 is a sectional view of a contactor 61 according to the variation of the third embodiment. In FIG. 11, the same elements as those of FIG. 6 are referred to by the same numerals and a description thereof is omitted. The contactor 61 includes a contact electrode holding part 62 having a positioning mechanism and the elastic electrode holding part 53. The contactor 61 is equal in configuration to the contactor 51 of FIG. 6 except for the shape of the contact electrode holding part 62.

Referring to FIG. 11, the contact electrode holding part 62 is not shaped like a plate, and includes a guide part 62a formed to surround the mounted IC package 22. The guide part 62a forms an opening slightly greater than the periphery of the IC package 22. The IC package 22 is dropped into the opening so that the IC package 22 is positioned. An inclined surface 63 extending from the opening is formed on the guide part 62a so that the IC package 22 can be dropped into the opening easily.

Further, the guide part 62a has holes 64 into which the corresponding external electrodes 22a of the IC package 22 are fitted. The contact electrodes 30 are contained in the holes 64. Accordingly, the external electrodes 22a of the IC package 22 dropped into the opening of the guide part 62a enter the corresponding holes 64 so as to come into contact with the contact electrodes 30. In this state, by pressing the IC package 22 from its upper side, the contact pins 23 of the elastic electrode holding part 53 are pressed so that the terminals (not graphically represented) of the test circuit board 25 and the external electrodes 22a of the IC package 22 are electrically connected.

Thus, by using the contact electrode holding part 52 having the guide part 62a, the IC package 22 can be easily mounted on the contactor 61, and at the same time, the IC package 22 can be positioned with accuracy.

Figure 12:
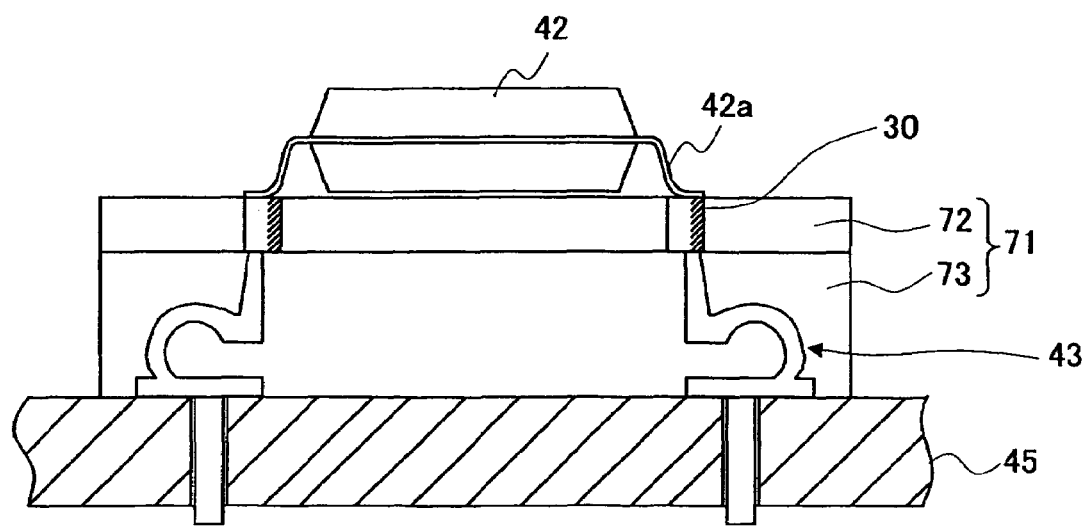
FIG. 12 is a sectional view of a contactor according to a fourth embodiment of the present invention.

Next, a description is given, with reference to FIG. 12, of a fourth embodiment of the present invention. FIG. 12 is a sectional view of a contactor 71 according to the fourth embodiment of the present invention. In FIG. 12, the same elements as those of FIG. 5 are referred to by the same numerals and a description thereof is omitted.

The contactor 71 includes a contact electrode holding part 72 holding the contact electrodes 30 and an elastic electrode holding part 73 holding the spring electrodes 43. The contact electrode holding part 72 is formed as a component separate from the elastic electrode holding part 73 so as to be separable easily therefrom. Accordingly, only the elastic electrode holding part 73 is fixed to the test circuit board 45, and the IC package 42 is mounted on the contact electrode holding part 72 with the contact electrode holding part 72 being placed on the elastic electrode holding part 73.

According to this embodiment, the contact electrode holding part 72 holding the multiple contact electrodes 30 is formed as a separable single component. Accordingly, in the case of replacing the contact electrodes 30, the multiple contact electrodes 30 may be replaced simultaneously by replacing the contact electrode holding part 72.

For instance, when the contact electrodes 30 are used for a long period of time so that the contact parts thereof are worn out or oxidized to cause degradation of contact, it is possible to use the contactor 71 by replacing only the contact electrode holding part 72 with a new one without replacing the elastic electrode holding part 73, whose manufacturing cost is relatively high. Accordingly, it is possible to reduce contactor costs.

Further, as in the above-described third embodiment, when foreign material is attached to the contact part of the contact electrode 30, the foreign material can be easily removed after detaching the contact electrode holding part 72. At this point, the detached contact electrode holding part 72 may be returned to where it was immediately after the foreign material is removed therefrom by cleaning. Alternatively, the detached contact electrode holding part 72 may be replaced with another clean contact electrode holding part 72. As a result, it is possible to remove the foreign material from the detached contact electrode holding part 72 in a separate process while continuing a test. Accordingly, the test process can be continued without being affected by the attachment of the foreign material.

Figure 13:
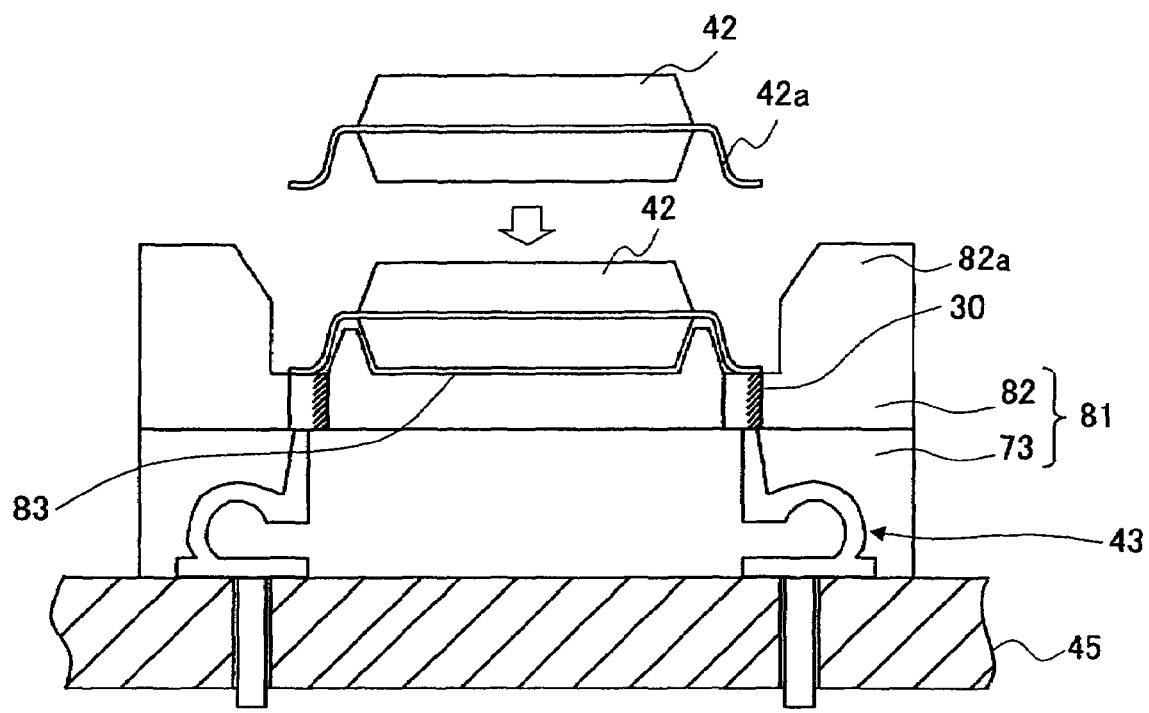
FIG. 13 is a sectional view of a contactor according to a variation of the fourth embodiment of the present invention.

Next, a description is given, with reference to FIG. 13, of a variation of the fourth embodiment. FIG. 13 is a sectional view of a contactor 81 according to the variation of the fourth embodiment. In FIG. 13, the same elements as those of FIG. 12 are referred to by the same numerals and a description thereof is omitted. The contactor 81 includes a contact electrode holding part 82 having a positioning mechanism and the elastic electrode holding part 73. The contactor 81 is equal in configuration to the contactor 71 of FIG. 12 except for the shape of the contact electrode holding part 82.

Referring to FIG. 13, the contact electrode holding part 82 is not shaped like a plate, and includes a guide part 82a formed to surround the mounted IC package 42. The guide part 82a forms an opening slightly greater than the periphery of the external electrodes 42a of the IC package 42. The IC package 42 is dropped into the opening so that the IC package 42 is positioned. Further, the guide part 82a has an opening 83 into which the main body of the IC package 42 is fitted.

Accordingly, the external electrodes 42a of the IC package 42 dropped into the opening of the guide part 82a are disposed with accuracy on the corresponding contact electrodes 30 exposed on the bottom surface of the opening part so as to come into contact with the contact electrodes 30. In this state, by pressing the IC package 42 from its upper side, the spring electrodes 43 of the elastic electrode holding part 73 are pressed so that the terminals (not graphically represented) of the test circuit board 45 and the external electrodes 42a of the IC package 42 are electrically connected.

Thus, by using the contact electrode holding part 82 having the guide part 82a, the IC package 42 can be easily mounted on the contactor 81, and at the same time, the IC package 42 can be positioned with accuracy.

Next, a description is given of the configuration of the contact electrode 30 in the above-described embodiments.

Figure 14A:
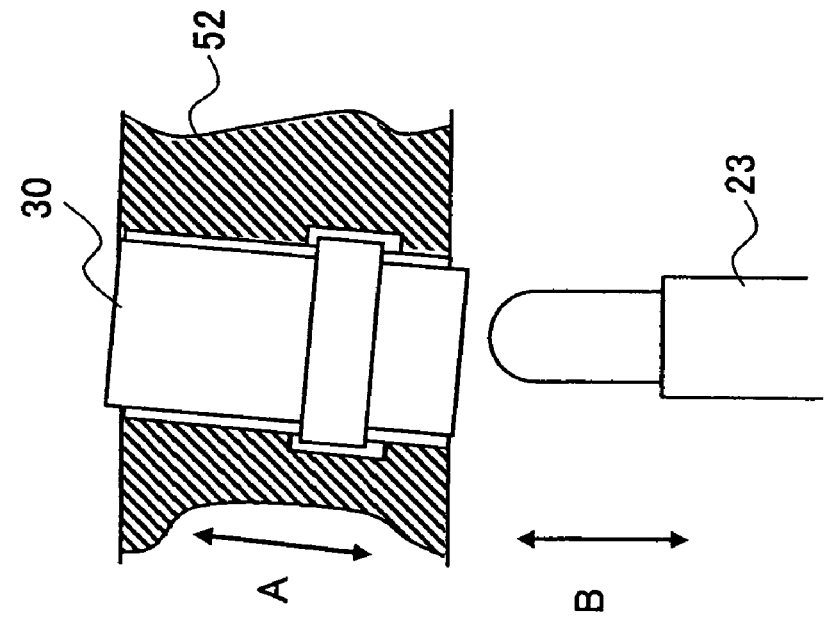
FIGS. 14A and 14B are diagrams for illustrating configurations of the contact electrode according to the present invention.

In the above-described embodiments, as shown in FIG. 14A, the directions in which the contact electrode 30 moves in the contact electrode holding part (indicated by double-headed arrow A) coincide with the directions in which the pressing force of the contact pin 23 (or the spring electrode 43) is exerted (indicated by double-headed arrow B). As a result, variations in the height of the external electrodes of the IC package to be contacted by the contact electrodes 30 can be absorbed so that substantially the same contact pressure can be obtained for each external electrode.

Figure 14B:
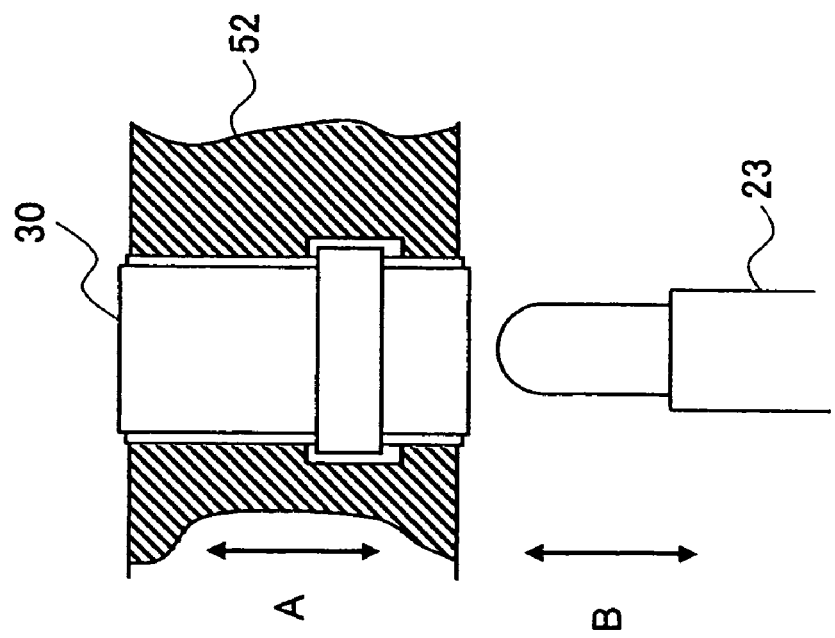
Figure 15:
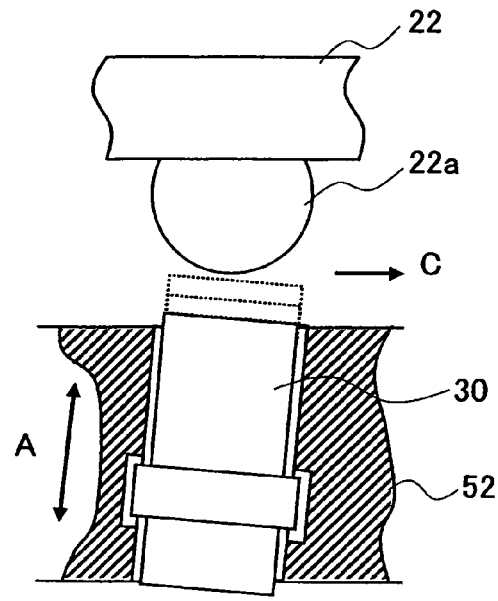
FIG. 15 is a diagram showing a movement of the contact electrode of FIG. 14B when the contact electrode comes into contact with an external electrode according to the present invention.

Here, as shown in FIG. 14B, the directions of movement of the contact electrode 30 (indicated by double-headed arrow A) may be inclined slightly with respect to the directions in which the pressing force of the contact pin 23 (or the spring electrode 43) is exerted (indicated by double-headed arrow B). As shown in FIG. 15, according to this configuration, when the contact electrode 30 comes into contact with the external electrode 22a, the contact point moves in a direction indicated by arrow C so that the contact electrode 30 rubs the surface of the external electrode 22a. As a result of this rubbing, an oxide film on the surface of the external electrode 22a and an oxide film on the surface of the contact electrode 30 can be broken so that good contact can be obtained. Further, if foreign material is deposited on the surface of the external electrode 22a or the surface of the contact electrode 30, the foreign material can be removed.

Figure 16:
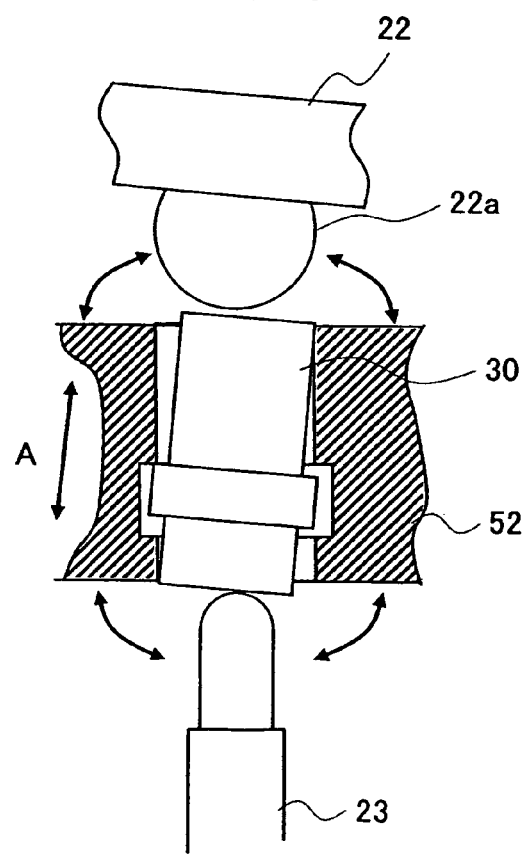
FIG. 16 is a diagram for illustrating a configuration supporting the contact electrode according to the present invention.

Further, by providing play to a part supporting the contact electrode 30, the directions of movement of the contact electrode 30 can be suitably changed. As shown in FIG. 16, by providing a suitable gap between the inner wall of an opening inside which the contact electrode 30 is supported thereby and the circumferential surface of the contact electrode 30, the contact electrode 30 can be slightly inclined inside the opening. As a result, for instance, even if the external electrode 22a is pressed in a direction inclined with respect to the direction in which the contact pin 23 is pressed, the contact electrode 30 is inclined in the opening so as to absorb the inclination so that the contact electrode 30 can move smoothly.

Figure 17:
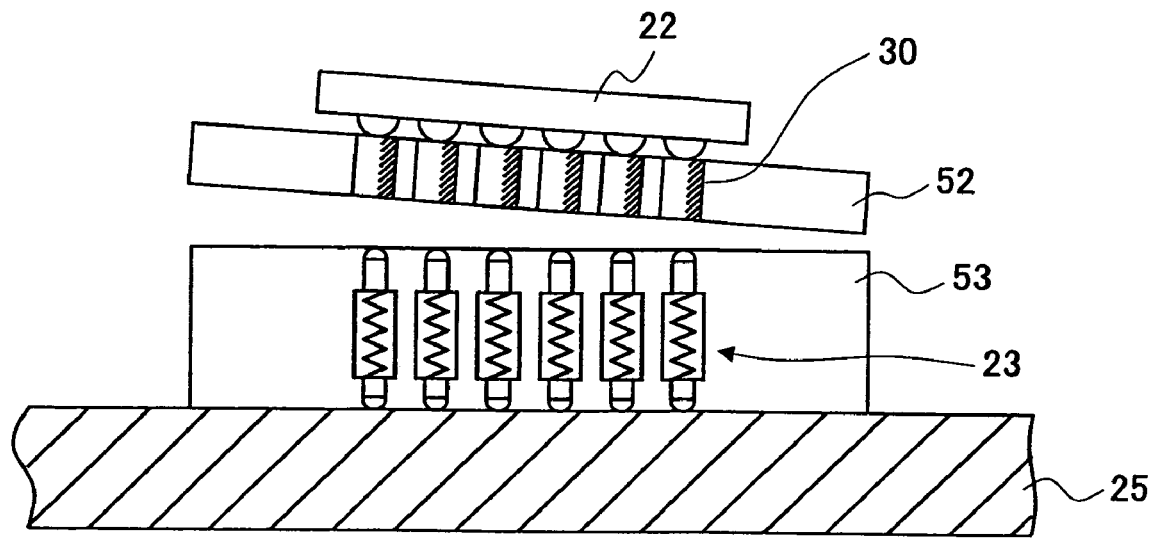
FIG. 17 is a diagram showing a test that is conducted using a contactor provided with the contact electrode supporting configuration shown in FIG. 16 according to the present invention.

FIG. 17 is a diagram showing a test that is conducted using a contactor provided with the contact electrode supporting configuration shown in FIG. 16. Even if the IC package 22 and the contact electrode holding part 52 are disposed on the elastic electrode holding part 53 at an angle thereto, each contact electrode 30 automatically becomes inclined and moves. Accordingly, the pressing force from the IC package 22 can be transmitted smoothly to the contact pins 23.

Figure 18:
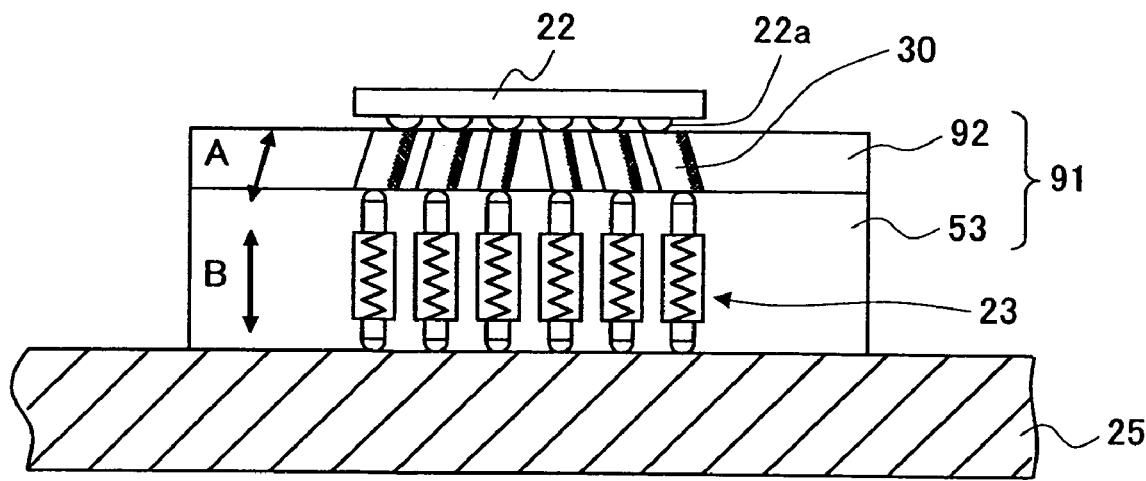
FIG. 18 is a sectional view of a contactor according to a fifth embodiment of the present invention.

Next, a description is given, with reference to FIG. 18, of a contactor 91 according to a fifth embodiment of the present invention. FIG. 18 is a sectional view of the contactor 91 according to the fifth embodiment. In FIG. 18, the same elements as those of FIG. 6 are referred to by the same numerals and a description thereof is omitted.

The contactor 91 includes a contact electrode holding part 92 instead of the contact electrode holding part 52. The contact electrode holding part 92 holds the multiple contact electrodes 30, which are provided to be inclined based on the electrode arrangement of the IC package 22 to be tested.

That is, referring to FIG. 18, the external electrodes 22a of the IC package are arranged with a pitch narrower than a pitch with which the contact pins 23 are arranged. The openings provided in the contact electrode holding part 92 which openings support the contact electrodes 30 are inclined in accordance with this configuration. Accordingly, on the lower face (opposite the elastic electrode holding part 53) of the contact electrode holding part 92, the openings supporting the contact electrodes 30 are arranged with the same pitch as the contact pins 23. Meanwhile, on the upper face (opposite the IC package 22) of the contact electrode holding part 92, the openings supporting the contact electrodes 30 are arranged with the same pitch as the external electrodes 22a.

According to this embodiment, IC packages of different pitches for electrode arrangement can be tested by changing the inclinations of the contact electrode supporting openings of the contact electrode holding part 92. If multiple contact electrode holding parts 92 different in opening inclination are prepared, IC packages of different electrode arrangement pitches can be tested using the same elastic electrode holding part 53 by changing only the contact electrode holding part 92. For instance, IC packages of three different electrode arrangement pitches can be tested by preparing the contact electrode holding part 92 with the non-inclined contact electrodes 30, the contact electrode holding part 92 with the contact electrodes 30 with inward inclinations in the upward direction as shown in FIG. 18, and the contact electrode holding part 92 with the contact electrodes 30 with outward inclinations in the upward direction.

Figure 19:
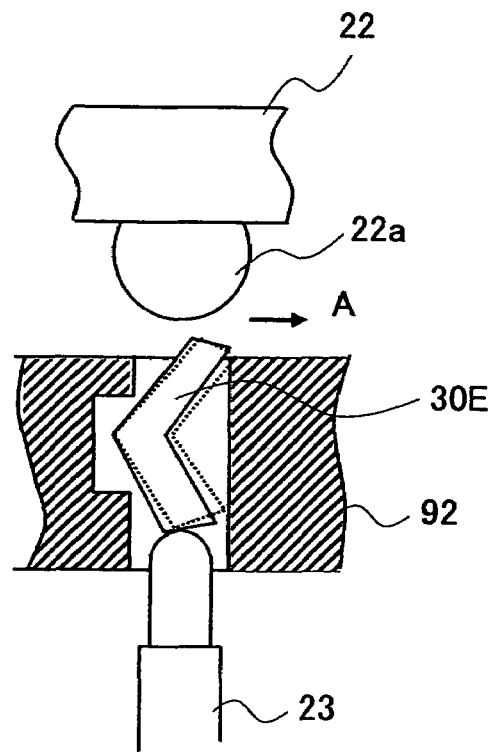
FIG. 19 is a diagram showing a contact electrode provided in a contactor and its vicinity according to a sixth embodiment of the present invention.

Next, a description is given, with reference to FIG. 19, of a contactor according to a sixth embodiment of the present invention. FIG. 19 is a diagram showing a contact electrode 30E provided in the contactor and its vicinity according to the sixth embodiment. The contactor according to this embodiment is equal in configuration to those of the above-described embodiments except for the contact electrode holding part including the contact electrodes 30E. Accordingly, a description is given below only of the contact electrodes 30E.

Referring to FIG. 19, each contact electrode 30E according to this embodiment is formed of an electrically conductive elastic body (for instance, a metal piece) shaped like a bent stick, and is held in a corresponding opening formed in the contact electrode holding part 92. When the contact electrode 30E is pressed between the external electrode 22a of the IC package 22 and the contact pin 23, the contact part of the contact electrode 30E is displaced slightly in a direction (indicated by arrow A) perpendicular to the direction in which the contact electrode 30E is pressed. As a result of this displacement, the surface of the external electrode 22a is rubbed so that an oxide film on the external electrode 22a is broken. As a result, good contact can be obtained.

Figure 20:
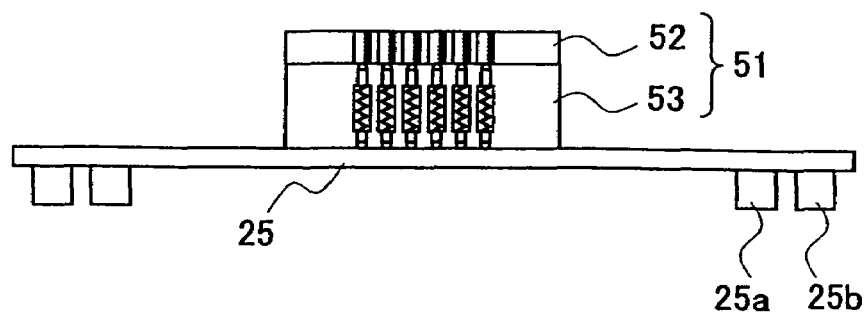
FIG. 20 is a schematic diagram showing an overall view of a test circuit board to which the contactor shown in FIG. 6 is attached according to the present invention.

FIG. 20 is a schematic diagram showing an overall view of the test circuit board 25 to which the contactor 51 shown in FIG. 6 is attached. Here, the contactor 51 represents the contactors according to the present invention. A circuit necessary for a test is formed on the test circuit board 25. Further, an electronic component 25a for forming the circuit necessary for the test and a connector 25b for connecting the test circuit board 25 to a testing apparatus are mounted on the test circuit board 25.

Figure 21:
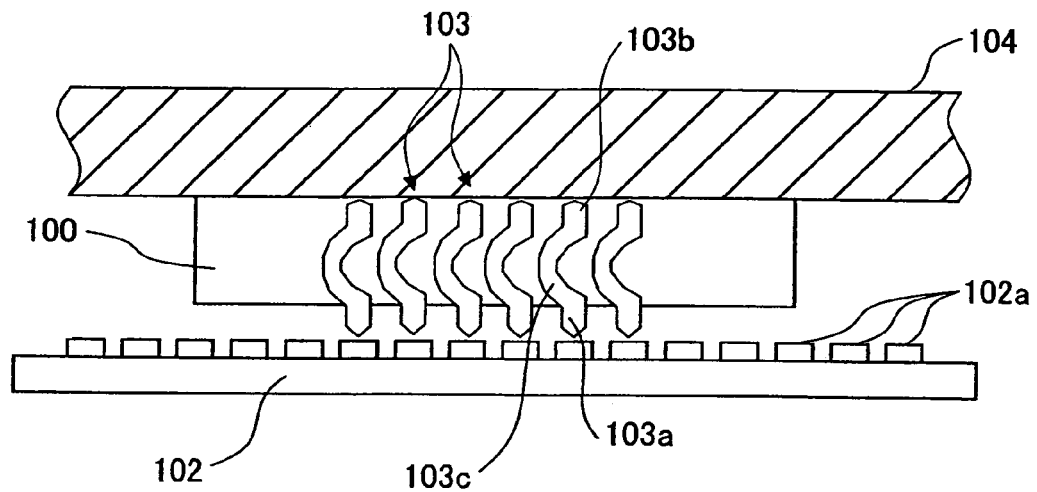
FIG. 21 is a sectional view of a contactor having spring electrodes as contact pins according to the present invention.

Next, FIG. 21 is a sectional view of a contactor 100 having spring electrodes as contact pins. The contactor 100, which is used to test the characteristics of an IC chip (wafer) 102, includes multiple contact pins 103. Each contact pin 103 has a contact electrode part 103a connected to a corresponding one of external electrodes 102a of the IC chip 102 and a contact electrode part 103b connected to a corresponding terminal (not graphically represented) of a test circuit board 104. A spring electrode part 103c is provided between the contact electrode parts 103a and 103b so that the contact electrode parts 103a and 103b and the spring electrode part 103c are integrated as the contact pin 103. The urging (spring) force of the spring electrode part 103c causes the contact electrode part 103a and the corresponding external electrode 102a of the IC chip 102 to be electrically connected. The urging force of the spring electrode part 103c presses the contact electrode part 103b on the test circuit board 104 side against the corresponding terminal of the test circuit board 104. The urging force of the spring electrode part 103c presses the contact electrode part 103a against the corresponding external electrode 102a of the IC chip 102, so that a suitable contact pressure is generated.

According to this configuration, the terminals of the test circuit board 104 are electrically connected to the corresponding external electrodes 102a of the IC chip 102 through the contact pins 103, so that an electrical test can be conducted on the IC chip 102. Each contact pin 103 is an integrated unit with the contact electrode parts 103a and 103b being fixed to the ends of the spring electrode part 103c. The contact pins 103 are arranged in the contactor 100 in accordance with the arrangement of the external electrodes 102a of the IC chip 102.

Figure 22:
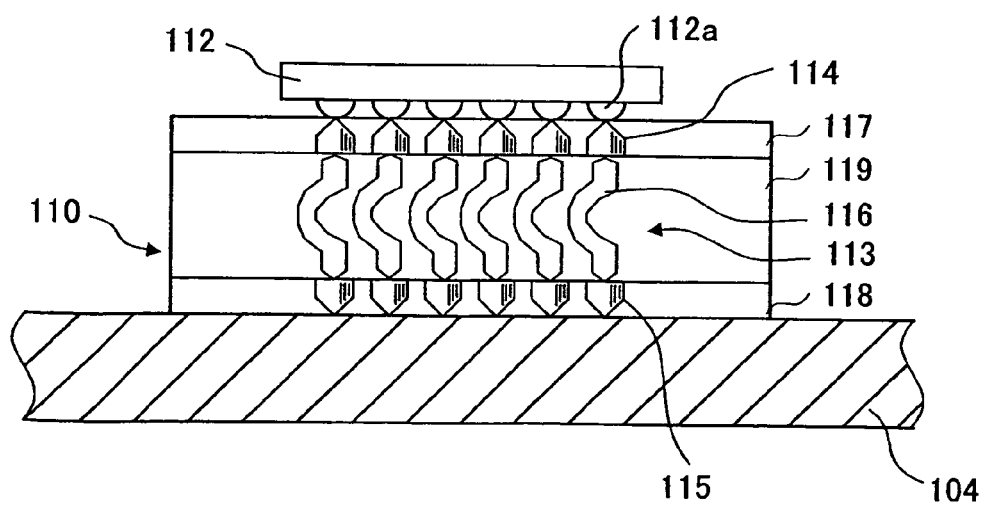
FIG. 22 is a sectional view of a contactor according to a seventh embodiment of the present invention.

Next, a description is given, with reference to FIG. 22, of a contactor 110 according to a seventh embodiment of the present invention. FIG. 22 is a sectional view of the contactor 110 according to the seventh embodiment. The contactor 110, which is used to test the characteristics of a BGA-type IC package 112, includes multiple contact pins 113. Each contact pin 113 includes a contact electrode (a first contact electrode) 114 contacting a corresponding one of external electrodes 112a of the IC package 112 and a contact electrode (a second contact electrode) 115 contacting a corresponding terminal of a test circuit board 104.

A spring electrode (an elastic electrode) 116 is provided between the first and second contact electrodes 114 and 115 so as to electrically connect the first contact electrode 114 for the IC package 112 and the second contact electrode 115 for the test circuit board 104. The spring electrode 116, which is an electrically conductive elastic body, urges the first and second contact electrodes 114 and 115 in opposite directions. The urging (spring) force of the spring electrode 116 causes a suitable contact pressure to be generated between the first contact electrode 114 and the external electrode 112a of the IC package 112. Likewise, the urging force of the spring electrode 116 causes a suitable contact pressure to be generated between the second contact electrode 115 and the terminal of the test circuit board 104.

Each spring electrode 116 shown in FIG. 22 is formed, for instance, by bending a copper alloy pin into a dogleg, and generates an elastic force as a result of its shape. However, the elastic force may be generated by reason other than the shape. For instance, the material itself of the spring electrode 116 may be an electrically conductive elastic body.

Thus, each contact pin 113 functions as an elastic electrode that generates a contact pressure.

According to this embodiment, the first and second contact electrodes 114 and 115 forming each contact pin 113 are separate components separable from each other, and each one of the first and second contact electrodes 114 and 115 is easily replaceable.

In the case of FIG. 22, the contactor 110 includes a first contact electrode holding part 117, a spring electrode holding part 119, and a second contact electrode holding part 118. The first contact electrodes 114 are held by the first contact electrode holding part 117, the spring electrodes 116 are held by the spring electrode holding part 119, and the second contact electrodes 115 are held by the second contact electrode holding part 118. For instance, if dust is attached to any of the contact electrodes 114 on the IC package 112 side, the first contact electrode holding part 117 may be detached from the spring electrode holding part 119 and cleaned. Alternatively, the first contact electrode holding part 117 may be replaced with a clean one. The same applies to the second contact electrode holding part 118.

Further, the first and second contact electrodes 114 and 115 may have the same configuration as any of the contact electrodes of the above-described embodiments. The first and second contact electrode holding parts 117 and 118 may have the same configuration as any of the contact electrode holding parts of the above-described embodiments.

Figure 23:
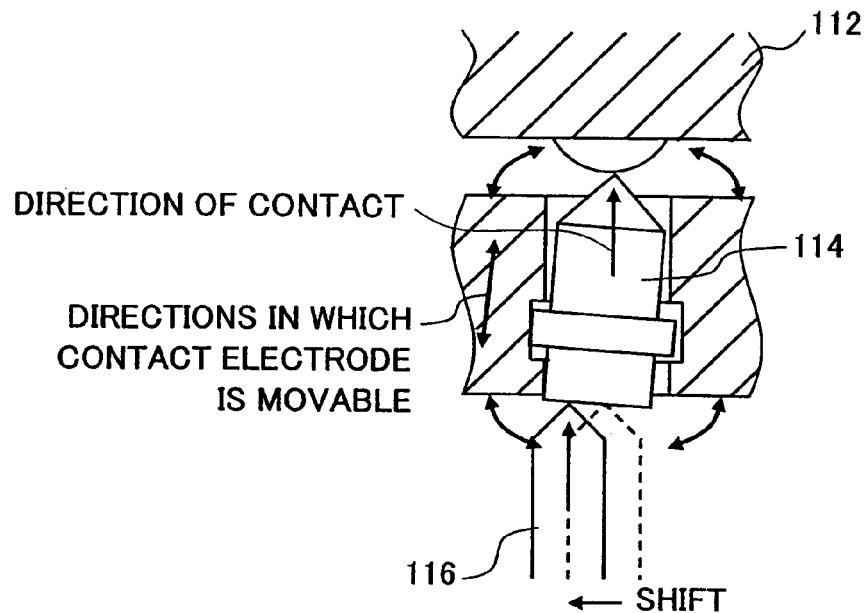
FIG. 23 is a sectional view of an IC chip-side contact electrode of the contactor and its vicinity according to the seventh embodiment of the present invention.
Figure 24:
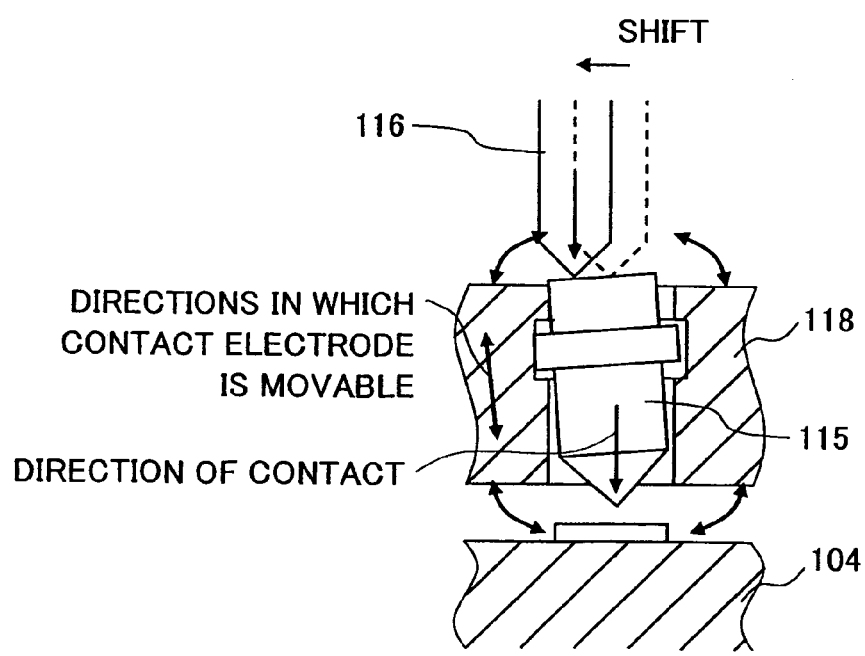
FIG. 24 is a sectional view of a test circuit board-side contact electrode of the contactor and its vicinity according to the seventh embodiment of the present invention.

For instance, the first contact electrodes 114 and the first contact electrode holding part 117 may be configured as shown in FIG. 23 so that each first contact electrode 114 can be inclined with respect to a direction in which the corresponding spring electrode 116 is pressed. That is, the first contact electrode 114 can be slightly inclined inside an opening by providing a suitable gap between the circumferential surface of the first contact electrode 114 and the inner wall of the opening. In this case, for instance, even if the spring electrode 116 buckles and shifts its position, the first contact electrode 114 becomes inclined in the opening so as to absorb the shift, so that the first contact electrode 114 can press the center position of the external electrode 112a of the IC package 112 in a substantially vertical direction. The same applies to the second contact electrodes 115. The second contact electrodes 115 and the second contact electrode holding part 118 may be configured as shown in FIG. 24.

Alternatively, for instance, each first contact electrode 114 may be an electrically conductive elastic body (for instance, a metal piece) shaped like a bent stick as shown in FIG. 19. When this first contact electrode 114 is pressed between the external electrode 112a of the IC package 112 and the spring electrode 116, the contact part of the contact electrode 114 is displaced slightly in a direction perpendicular to a direction in which the contact electrode 114 is pressed. As a result of this displacement, the surface of the external electrode 112a is rubbed so that an oxide film on the external electrode 112a is broken. As a result, good contact can be obtained. The same applies to the second contact electrodes 115.

Figure 25:
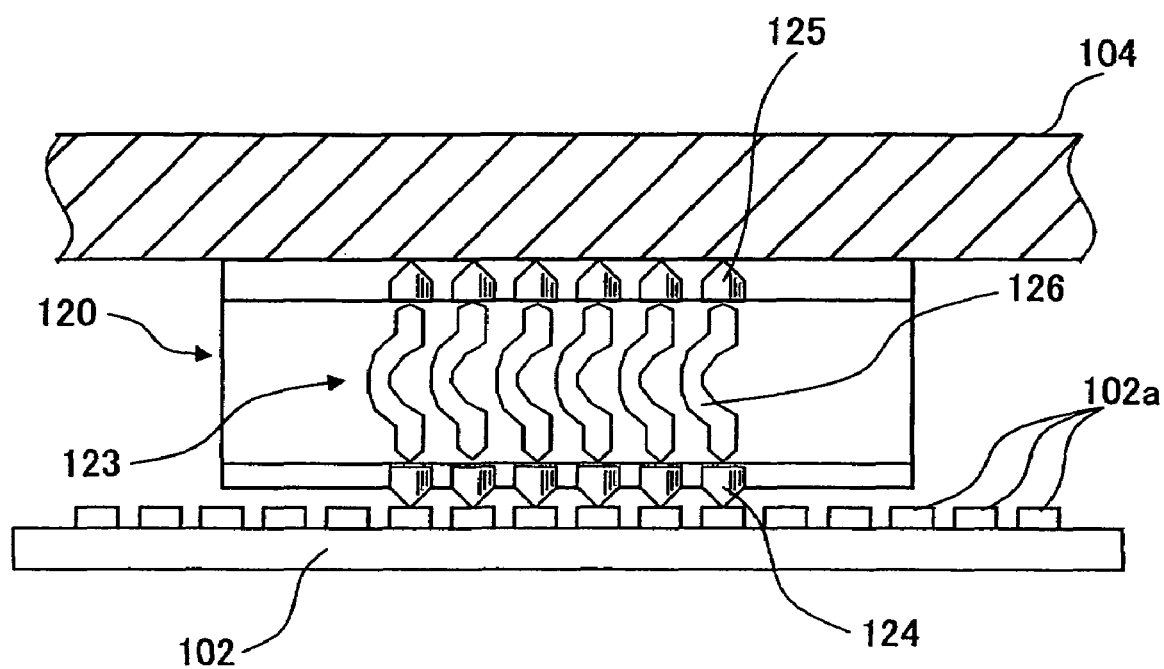
FIG. 25 is a sectional view of a contactor according to an eighth embodiment of the present invention.

Next, a description is given, with reference to FIG. 25, of an eighth embodiment of the present invention. FIG. 25 is a sectional view of a contactor 120 according to the eighth embodiment. The contactor 120, which is used to test the characteristics of the IC chip 102 (that is, a wafer), includes multiple contact pins 123. Each contact pin 123 includes a first contact electrode 124 contacting the corresponding external electrode 102a of the IC chip 102 and a second contact electrode 125 contacting the corresponding terminal of the test circuit board 104.

A spring electrode 126 is provided between the first and second contact electrodes 124 and 125 so as to electrically connect the first contact electrode 124 for the IC chip 102 and the second contact electrode 125 for the test circuit board 104. The spring electrode 126, which is an electrically conductive elastic body, urges the first and second contact electrodes 124 and 125 in opposite directions. The urging (spring) force of the spring electrode 126 causes a suitable contact pressure to be generated between the first contact electrode 124 and the external electrode 102a of the IC chip 102. Likewise, the urging force of the spring electrode 126 causes a suitable contact pressure to be generated between the second contact electrode 125 and the terminal of the test circuit board 104.

The configuration of this embodiment is equal in the other aspects to that of the seventh embodiment and a description thereof is omitted.

In the above-described embodiments, as a contact electrode material, a metal material such as steel (an SK steel) or copper alloy as a conductive material is preferably used. Surface treatment may be applied on the contact part of the contact electrode. For instance, the contact part of the contact electrode may be plated with a platinum metal such as rhodium or palladium, to which solder is less likely to be transferred, or an alloy of such platinum metals. Further, the contact part of the contact electrode may be plated with metal having high hardness so as to prevent wear of the contact part. Further, in the case of alloy materials composed of sliver, platinum, copper, gold, and palladium, no surface plating is necessary. Even if the surface of the contact part is further polished, the surface is prevented from being oxidized, so that good contact can be maintained. Accordingly, such alloy materials may be employed.

According to the above-described configuration, the terminals of the test circuit board are electrically connected to the corresponding external electrodes of the IC package or IC chip through the contact pins and the contact electrodes, so that an electrical test can be conducted on the IC package or IC chip.

According to the seventh and eighth embodiments, first contact electrodes, which are components separate from spring electrodes, are interposed between the contact pins and the external electrodes of the IC package or IC chip. Further, second contact electrodes, which are components separate from spring electrodes, are interposed between the contact pins and the terminals of the test circuit board. Accordingly, it is possible to replace only the first contact electrodes in accordance with the shape of the external electrodes of the IC package or IC chip. Further, when the second contact electrodes are worn out or broken or foreign material is attached thereto because of contact with the test circuit board, it is possible to replace only the second contact electrodes. Further, for instance, by shaping a contact part like a cone, it is possible to bring each second contact electrode into contact with the center of a terminal of the test circuit board with accuracy even if a contact electrode part moves horizontally because of buckling at the time of contact. Further, it is possible to bring the contact part into contact with the terminal of the test circuit board without damaging the terminal.

Thus, according to the present invention, a contactor that can easily have the size and shape of contact electrodes changed in accordance with the size and shape of the external electrodes of an IC package or IC chip to be contacted can be realized.

Further, according to the present invention, the contact electrodes are separable from the elastic electrodes. Therefore, it is possible to replace the contact electrodes with ease. Accordingly, it is possible to replace only the contact electrodes in accordance with the shape and size of the external electrodes of an electronic component. As a result, there is no need to replace the entire contactor. Further, there is no need to prepare multiple types of contactors for the external electrodes of various types of electronic components. Since it is possible to separate and detach only a contact electrode holding part holding the contact electrodes, it is possible to replace only the contact electrodes with new or cleaned ones with ease.

Further, according to the present invention, if the contact electrodes are worn out or broken or foreign material is attached to the contact electrodes in the case of bringing a contactor into contact with the terminals of a test circuit board, the contact electrodes are easily replaced. Further, when spring electrodes buckle at the time of contact, contact with the external terminals of an IC package or IC chip can be made with accuracy. Likewise, contact with the terminals of the test circuit board can be made with accuracy. Further, it is possible to bring the contactor into contact with the test circuit board without damaging the terminals of the test circuit board.

The present invention is not limited to the specifically disclosed embodiments, and variations and modifications may be made without departing from the scope of the present invention.

What is claimed is:

1. A contactor configured to be electrically connected to terminals of an electronic component, comprising:
   a plurality of contact electrodes configured to contact the terminals of the electronic component; and
   a plurality of elastic electrodes each composed of an electrically conductive elastic body, the elastic electrodes being configured to generate a pressing force for pressing the contact electrodes against the terminals of the electronic component,
   wherein the contact electrodes are separable from the elastic electrodes;
   a single contact electrode holding part configured to hold the contact electrodes; and
   an elastic electrode holding part configured to hold the elastic electrodes,
   wherein the contact electrode holding part is a component separate and separable from the elastic electrode holding part; and
   wherein the contact electrodes are in contact with the elastic electrodes in a non-fixed manner.

2. The contactor as claimed in claim 1, wherein:
   the contact electrode holding part is a plate-like member; and
   the contact electrodes are supported movably in openings provided through the plate-like member.

3. The contactor as claimed in claim 2, wherein the contact electrode holding part includes a positioning mechanism that positions the electronic component.

4. The contactor as claimed in claim 3, wherein the positioning mechanism is configured to guide the electronic component to a predetermined position based on a shape of the electronic component.

5. The contactor as claimed in claim 2, wherein an axial direction of each opening of the contact electrode holding part is different from a direction of the pressing force generated by the elastic electrodes.

6. The contactor as claimed in claim 2, wherein a direction in which each contact electrode moves in a corresponding one of the openings of the contact electrode holding part is inclinable with respect to a direction of the pressing force generated by the elastic electrodes.

7. The contactor as claimed in claim 2, wherein:
   the contact electrode holding part includes opposite first and second faces, the first face opposing the electronic component; and
   the openings are spaced on the first face with a pitch different from a pitch with which the openings are spaced on the second face.

8. The contactor as claimed in claim 2, wherein each contact electrode is bent in a corresponding one of the openings and is elastically deformable by the pressing force from the elastic electrodes.

9. The contactor as claimed in claim 1, wherein the contact electrode holding part is integrated with the contact electrodes as a single unit.

10. The contactor as claimed in claim 1, wherein each of the contact electrodes has opposite first and second ends that are shaped differently, the first end being shaped in accordance with a shape of a corresponding one of the terminals of the electronic component, the second end being shaped suitably for a flat electrode.

11. A contactor configured to electrically connect a circuit board to a terminal of an electronic component, comprising:
   a first contact electrode configured to contact the terminal of the electronic component;
   a second contact electrode configured to contact a terminal of the circuit board; and
   an elastic electrode formed of an electrically conductive elastic body, the elastic electrode being provided between the first and second contact electrodes,
   wherein at least one of the first and second contact electrodes is separable from the elastic electrode;
   a first contact electrode holding part holding the first contact electrode;
   a second contact electrode holding part holding the second contact electrode; and
   an elastic electrode holding part holding the elastic electrode, wherein at least one of the first contact electrode holding part and the second contact electrode holding part is a component separate and separable from the elastic electrode holding part; and
   wherein the first contact electrode is in contact with the elastic electrode in a non-fixed manner, and the second contact electrode is in contact with the elastic electrode in a non-fixed manner.

12. The contactor as claimed in claim 11, wherein at least one of the first and second contact electrodes is inclinable with respect to a direction of a pressing force generated by the elastic electrode.

13. The contactor as claimed in claim 11, wherein at least one of the first and second contact electrodes is elastically deformable by a pressing force from the elastic electrode.

* * * * *